(12) United States Patent
Kim et al.

(10) Patent No.: US 9,209,177 B2
(45) Date of Patent: Dec. 8, 2015

(54) SEMICONDUCTOR DEVICES INCLUDING GATES AND DUMMY GATES OF DIFFERENT MATERIALS

(71) Applicant: Samsung Electronics Co., Ltd., Suwon-si (KR)

(72) Inventors: Yoon-Hae Kim, Suwon-si (KR); Jong-Shik Yoon, Yongin-si (KR); Young-Gun Ko, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/783,513

(22) Filed: Mar. 4, 2013

(65) Prior Publication Data

US 2014/0203362 A1 Jul. 24, 2014

(30) Foreign Application Priority Data

Jan. 23, 2013 (KR) ........................ 10-2013-0007641

(51) Int. Cl.
*H01L 27/12* (2006.01)
*H01L 27/088* (2006.01)
*H01L 21/8234* (2006.01)

(52) U.S. Cl.
CPC .... *H01L 27/0886* (2013.01); *H01L 21/823431* (2013.01)

(58) Field of Classification Search
CPC ............... H01L 29/6681; H01L 29/66545; H01L 29/41791; H01L 27/1211; H01L 21/823431
USPC .......... 257/9, 20, 76–77, 274, 302, 328–331, 257/347, 368, 384, 401, 613, E21.014, 257/E21.209, E21.438, E21.442, E21.703, 257/E29.129, E29.13, E29.137, E29.151, 257/E29.302; 438/196, 197, 201, 218, 257, 438/261, 264, 593
See application file for complete search history.

(56) References Cited

U.S. PATENT DOCUMENTS

| | | | |
|---|---|---|---|
| 4,998,150 A * | 3/1991 | Rodder et al. ................. 257/288 |
| 6,204,137 B1 | 3/2001 | Teo et al. |
| 6,885,055 B2 | 4/2005 | Lee |
| 6,974,729 B2 * | 12/2005 | Collaert et al. ............... 438/157 |
| 7,009,265 B2 | 3/2006 | Anderson et al. |
| 7,247,910 B2 | 7/2007 | Lee et al. |
| 7,473,623 B2 | 1/2009 | Chen et al. |
| 7,786,518 B2 | 8/2010 | Chakravarthi et al. |
| 7,863,152 B2 | 1/2011 | Lee et al. |
| 2004/0150075 A1* | 8/2004 | Kaji ............................ 257/632 |
| 2009/0315116 A1 | 12/2009 | Sakuma |
| 2011/0147765 A1 | 6/2011 | Huang et al. |
| 2012/0032293 A1 | 2/2012 | Chen et al. |
| 2012/0043624 A1* | 2/2012 | Liang et al. .................. 257/410 |
| 2012/0074477 A1 | 3/2012 | Kawakita |
| 2012/0091539 A1 | 4/2012 | Fan et al. |

(Continued)

FOREIGN PATENT DOCUMENTS

JP 08335629 A * 12/1996
KR 1020070088384 3/2009

*Primary Examiner* — Meiya Li
*Assistant Examiner* — Peter M Albrecht
(74) *Attorney, Agent, or Firm* — Myers Bigel Sibley & Sajovec, PA

(57) ABSTRACT

Semiconductor devices are provided. The semiconductor devices may include an active pattern and a insulation layer. The semiconductor devices may include a gate that is on the active pattern and that includes a first material, and a dummy gate that is on the insulation layer and that includes a second material different from the first material.

17 Claims, 16 Drawing Sheets

(56) References Cited

U.S. PATENT DOCUMENTS

| | | |
|---|---|---|
| 2012/0122286 A1 | 5/2012 | Kim et al. |
| 2012/0153393 A1 | 6/2012 | Liang et al. |
| 2013/0065371 A1* | 3/2013 | Wei et al. ............ 438/294 |
| 2013/0075796 A1* | 3/2013 | Tsai et al. ............ 257/288 |
| 2014/0035045 A1* | 2/2014 | Alptekin et al. ............ 257/368 |
| 2014/0117454 A1* | 5/2014 | Liu et al. ............ 257/368 |

\* cited by examiner

<u>8</u>

SEMICONDUCTOR DEVICES INCLUDING GATES AND DUMMY GATES OF DIFFERENT MATERIALS

CROSS-REFERENCE TO RELATED APPLICATION

This U.S. non-provisional application claims priority under 35 U.S.C. §119 to Korean Patent Application No. 10-2013-0007641, filed on Jan. 23, 2013, the disclosure of which is hereby incorporated by reference in its entirety.

BACKGROUND

The present disclosure relates to semiconductor devices including dummy gates. As the feature size of Metal Oxide Semiconductor (MOS) transistors has decreased, the length of a MOS transistor gate and the length of a channel formed therebelow have also gradually decreased. Accordingly, operating characteristics of a MOS transistor may be altered by even a slight change in a processing condition. Attempts have thus been made to improve operating characteristics of the MOS transistor.

SUMMARY

According to various embodiments of the present inventive concepts, semiconductor devices may include an active pattern and a field insulation layer spaced apart on a substrate. The semiconductor devices may include a gate that is on the active pattern and that includes a first material, and a dummy gate that is on the field insulation layer and that includes a second material different from the first material.

In various embodiments, the semiconductor devices may include a source/drain between the gate and the dummy gate. The source/drain may be an elevated source/drain having a top surface protruding beyond a bottom surface of the gate. The top surface of the source/drain may protrude beyond a bottom surface of the dummy gate. The semiconductor devices may further include at least one spacer adjacent the dummy gate, the at least one spacer overlapping a portion of the source/drain.

According to various embodiments, the first material may include a metal and the second material may include a non-metal (e.g., an insulating material or polysilicon). The semiconductor devices may include an interlayer dielectric layer on the dummy gate, and the dummy gate and the interlayer dielectric layer may include the same material. In some embodiments, the semiconductor devices may include a gap within the dummy gate.

In various embodiments, the semiconductor devices may include a gate insulation layer under the gate or the dummy gate, and the gate insulation layer may extend upwardly along sidewalls of the gate or the dummy gate. In some embodiments, a top surface of the active pattern may be substantially coplanar with a top surface of the field insulation layer. In some embodiments, the active pattern may include a fin shape protruding from the substrate.

According to various embodiments, semiconductor devices may include an active pattern and a field insulation layer on a substrate, a first gate insulation layer on the active pattern, a gate on the first gate insulation layer, a second gate insulation layer spaced apart from the first gate insulation layer and on the field insulation layer, and an interlayer dielectric layer on the gate and contacting the second gate insulation layer. The semiconductor devices may include a source/drain on the first gate insulation layer and the second gate insulation layer, and a top surface of the source/drain may protrude beyond a bottom surface of the second gate insulation layer. In some embodiments, the gate may include a metal and the interlayer dielectric layer may include an oxide layer, and a portion of the interlayer dielectric layer contacting the second gate insulation layer may include/provide a dummy gate.

In various embodiments, semiconductor devices may include an insulation layer on a substrate, a metal gate spaced apart from the insulation layer and on an active pattern of the substrate, and a non-metal dummy gate on the insulation layer. The semiconductor devices may include a source/drain between the metal gate and the non-metal dummy gate. The semiconductor devices may include a dielectric layer on the metal gate and the non-metal dummy gate, and the non-metal dummy gate may include the same material as the dielectric layer. In some embodiments, the non-metal dummy gate may include a gap therein. In some embodiments, the semiconductor devices may include a dielectric layer on the metal gate and the non-metal dummy gate, where the non-metal dummy gate and the dielectric layer may include different non-metal materials, a top surface of the active pattern and a top surface of the insulation layer may be substantially coplanar, and a top surface of the metal gate and a top surface of the non-metal dummy gate may be substantially coplanar.

BRIEF DESCRIPTION OF THE DRAWINGS

The above and other features and advantages of the disclosure will become more apparent in view of the attached drawings and accompanying detailed description.

DETAILED DESCRIPTION

Figure 1:
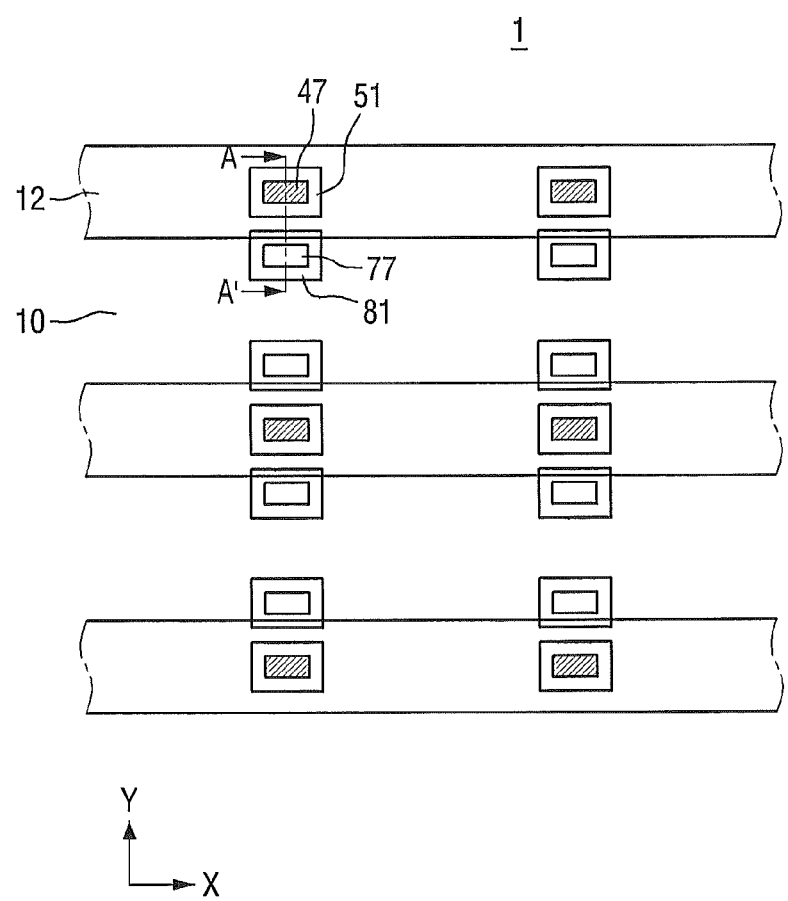
FIG. 1 is a layout view of a semiconductor device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
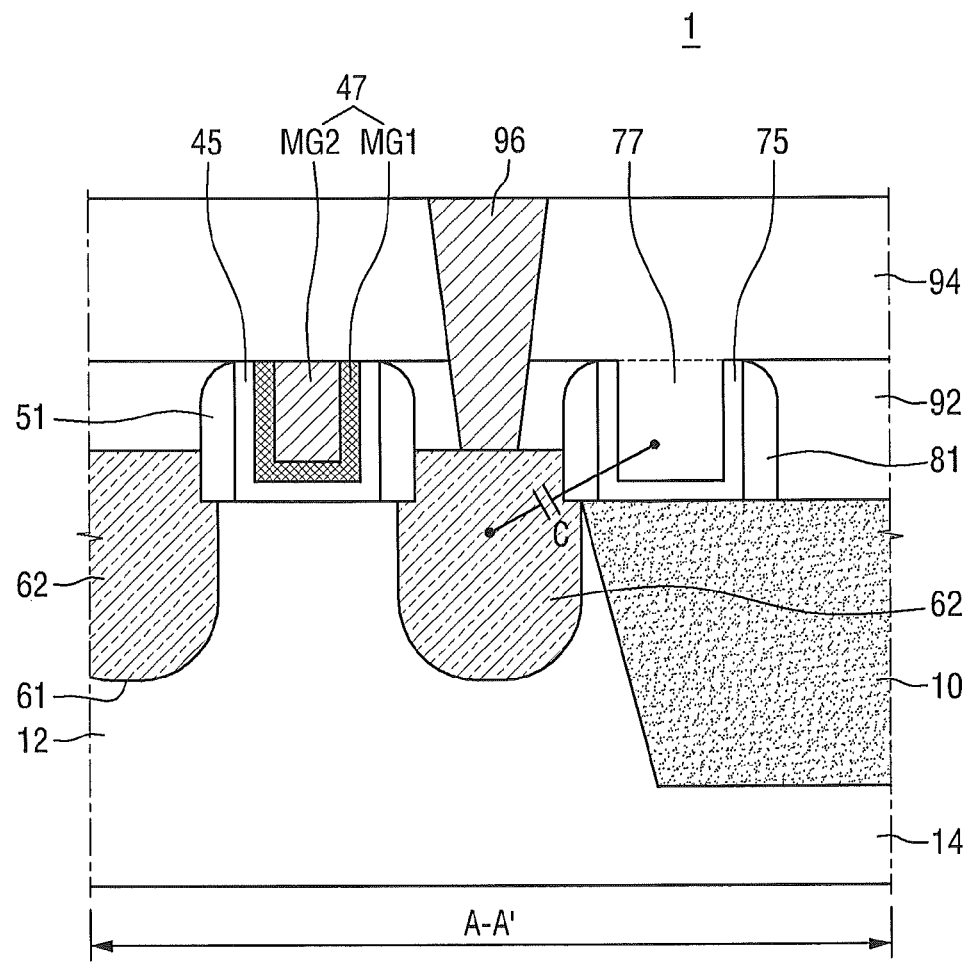
FIG. 2 is a sectional view taken along the line A-A' of FIG. 1.

FIG. 1 is a layout view of a semiconductor device according to some embodiments, and FIG. 2 is a sectional view taken along the line A-A' of FIG. 1. Although an N-type transistor gate is illustrated in FIG. 1 by way of example, the present inventive concepts are not limited thereto.

Referring to FIGS. 1 and 2, active patterns 12 and a field insulation layer 10 extending in parallel with each other in a first direction X may be formed on a substrate 14 of the semiconductor device 1 according to some embodiments. A normal gate 47 may be formed on one (or more) of the active patterns 12, and a dummy gate 77 may be formed on the field insulation layer 10. As an example, two dummy gates 77 formed on the field insulation layer 10 that is disposed between adjacent ones of the active patterns 12 are illustrated in FIG. 1, but aspects of the present inventive concepts are not limited thereto. In other words, in some other embodiments, the number of dummy gates 77 formed on the field insulation layer 10 that is disposed between adjacent ones of the active patterns 12 may vary. Moreover, it will be understood that the term "dummy gate," as used herein, may refer to a dummy structure or a dummy pattern adjacent a metal gate (i.e., the normal gate 47).

The substrate 14 may be a substrate made of one or more semiconductor materials selected from the group consisting of, for example, silicon (Si), germanium (Ge), silicon germanium (SiGe), gallium phosphide (GaP), gallium arsenide (GaAs), silicon carbide (SiC), silicon germanium carbon (SiGeC), indium arsenide (InAs), and indium phosphide (InP). In some embodiments, the substrate 14 may be a silicon-on-insulator (SOI) substrate. The field insulation layer 10 may be formed by, for example, patterning the substrate 14. The field insulation layer 10 may be, for example, an oxide layer, a nitride layer, an oxynitride layer, or combinations thereof. Specifically, the field insulation layer 10 may include, for example, a silicon oxide layer ($SiO_2$), a silicon nitride layer (SiN), and a silicon oxynitride layer (SiON), but the present inventive concepts are not limited thereto.

The normal gate 47 may include metal layers MG1 and MG2. For example, the normal gate 47 may be formed by stacking two or more of the metal layers MG1 and MG2. The first metal layer MG1 may serve to adjust a work function, and the second metal layer MG2 may serve to fill a space formed by the first metal layer MG1. The first metal layer MG1 may include, for example, at least one of titanium nitride (TiN), tantalum nitride (TaN), titanium carbide (TiC), and tantalum carbide (TaC). In addition, the second metal layer MG2 may include tungsten (W) or aluminum (Al). The normal gate 47 may be formed by, for example, a replacement process or a gate last process, but the present inventive concepts are not limited thereto.

The dummy gate 77 may be made of a different material from the normal gate 47. In detail, if the normal gate 47 is made of a metal, the dummy gate 77 may be made of a non-metal. In some embodiments, the dummy gate 77 may be an insulation layer. In more detail, the dummy gate 77 may be an insulation layer integrally formed with a second interlayer dielectric layer 94. The insulation layer forming the dummy gate 77 may be, for example, an oxide layer. In other words, the second interlayer dielectric layer 94 and the dummy gate 77 may both be oxide layers in some embodiments, but the present inventive concepts are not limited thereto. For example, various types of insulation layers may be used to form the dummy gate 77.

A gate insulation layer 45 may be formed under the normal gate 47. The gate insulation layer 45 may include a high-k dielectric material having a higher dielectric constant than a silicon oxide layer ($SiO_2$). For example, the gate insulation layer 45 may include hafnium oxide ($HfO_2$), zirconium dioxide ($ZrO_2$), or tantalum pentoxide ($Ta_2O_5$). Meanwhile, in some embodiments, the gate insulation layer 45 may upwardly extend along sidewalls of the normal gate 47 or the dummy gate 77, because the normal gate 47 or the dummy gate 77 may be formed using the gate last process.

A recess 61 may be formed on both (i.e., opposing) sides of the normal gate 47. In some embodiments, the recess 61 may also be formed between the normal gate 47 and the dummy gate 77. A source/drain 62 may be formed in the recess 61. The source/drain 62 may include an epitaxial layer. In other words, the source/drain 62 may be formed by epitaxial growth.

Meanwhile, in some embodiments, the source/drain 62 may be an elevated source/drain having a top surface higher (e.g., farther from a surface of the substrate 14) than a bottom surface of the normal gate 47 or the dummy gate 77. Moreover, as illustrated in FIG. 2, the source/drain 62 may be on both a sidewall and a lower/bottom surface of spacers 51 and 81. Accordingly, a portion of the source/drain 62 may undercut lower portions of the spacers 51 and 81.

The spacers 51 and 81 may include at least one of a nitride layer and an oxynitride layer. The spacers 51 and 81 may be formed on sidewalls of the normal gate 47 and the dummy gate 77, respectively. In FIG. 2, lateral surfaces of the spacers 51 and 81 are curved, but the present inventive concepts are not limited thereto. Rather, the shapes of the spacers 51 and 81 may vary. For example, in some embodiments, the spacers 51 and 81 may be formed in an I or L shape.

Referring again to FIG. 2, the topmost surface of the field insulation layer 10 may be formed at substantially the same height as the topmost surface of the active pattern 12. In other words, the topmost surfaces of the field insulation layer 10 and the active pattern 12, respectively, may be substantially coplanar. Accordingly, the topmost surface of the field insulation layer 10 may be lower than the top surface of the source/drain 62, but the present inventive concepts are not limited thereto. In some embodiments, the topmost surface of the field insulation layer 10 may also be lower than the topmost surface of the active pattern 12. For example, the topmost surface of the field insulation layer 10 may be formed at a lower height than the top surface of the active pattern 12, but the present inventive concepts are not limited thereto.

Meanwhile, a top surface of the dummy gate 77 may be substantially coplanar with the top surface of the normal gate 47. For example, when the dummy gate 77 and the normal gate 47 are formed by planarization, the top surfaces thereof may be positioned at substantially the same height. As shown in FIG. 2, a first interlayer dielectric layer 92 may be positioned on both (i.e., opposing) sides of the dummy gate 77 and the normal gate 47. The first interlayer dielectric layer 92 may be, for example, a planarization layer. Moreover, a contact 96 making contact with the source/drain 62 may be formed on the source/drain 62 and may extend through the first and second interlayer dielectric layers 92, 94.

In contrast with using the non-metal dummy gate 77 of FIG. 2, if the dummy gate 77 is made of, for example, a metal, a parasitic capacitance C may be formed between the dummy gate 77 and the source/drain 62. The parasitic capacitance C may cause leakage current between the dummy gate 77 and the source/drain 62. The dummy gate 77 of FIG. 2, however, in contrast with the metal normal gate 47, may be an insulation layer, and a parasitic capacitance C therefore may be reduced/not formed between the dummy gate 77 and the source/drain 62. Accordingly, leakage current may be reduced/not caused between the dummy gate 77 and the source/drain 62, thereby improving the reliability of the semiconductor device 1.

Figure 3:
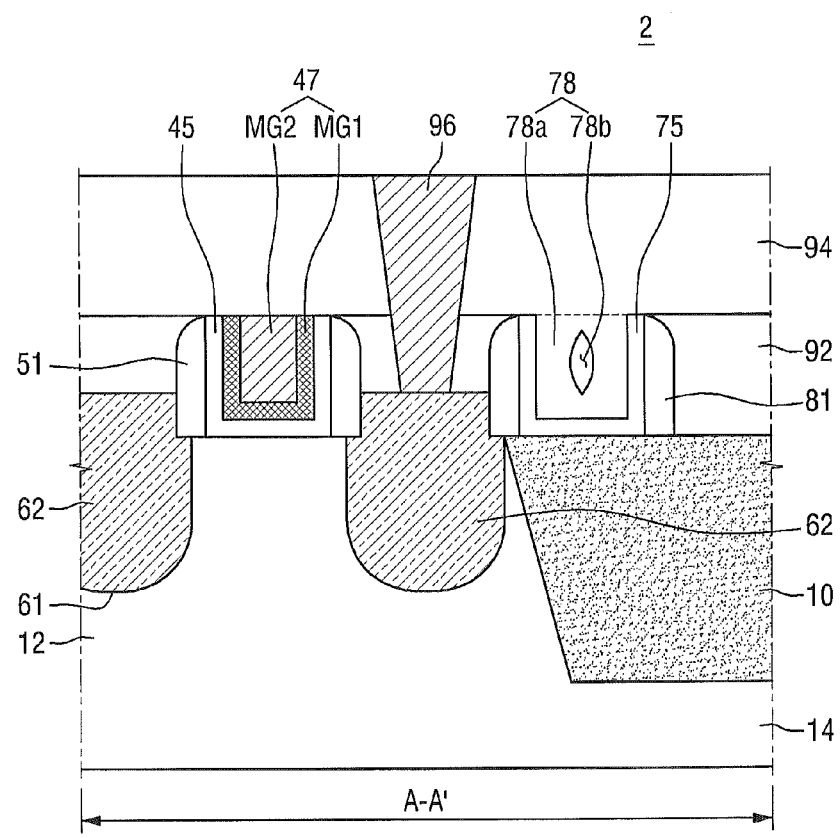
FIG. 3 is a sectional view of a semiconductor device according to some embodiments.

FIG. 3 is a sectional view of a semiconductor device according to some embodiments. In the following description, repeated explanations with respect to FIGS. 1 and 2 may be omitted, and the description of FIG. 3 may describe differences with respect to FIG. 2.

Referring to FIG. 3, the semiconductor device 2 according to some embodiments may include a gap 78b. It will be understood that a "gap," as described herein, may be an air gap and/or any type of void, cavity, or unobstructed space. The semiconductor device 2, according to some embodiments, may include a dummy gate 78 that includes an insulation layer 78a and the gap 78b. As described regarding the dummy gate 77 of FIG. 2, the insulation layer 78a forming the dummy gate 78 of FIG. 3 may be integrally formed with a second interlayer dielectric layer 94.

When the dummy gate 78 includes the gap 78b, parasitic capacitance between the dummy gate 78 and a source/drain 62 may be further reduced/protected against. Therefore, leakage current between the dummy gate 78 and the source/drain 62 may be further reduced/protected against, thereby improving the reliability of the semiconductor device 2.

Figure 4:
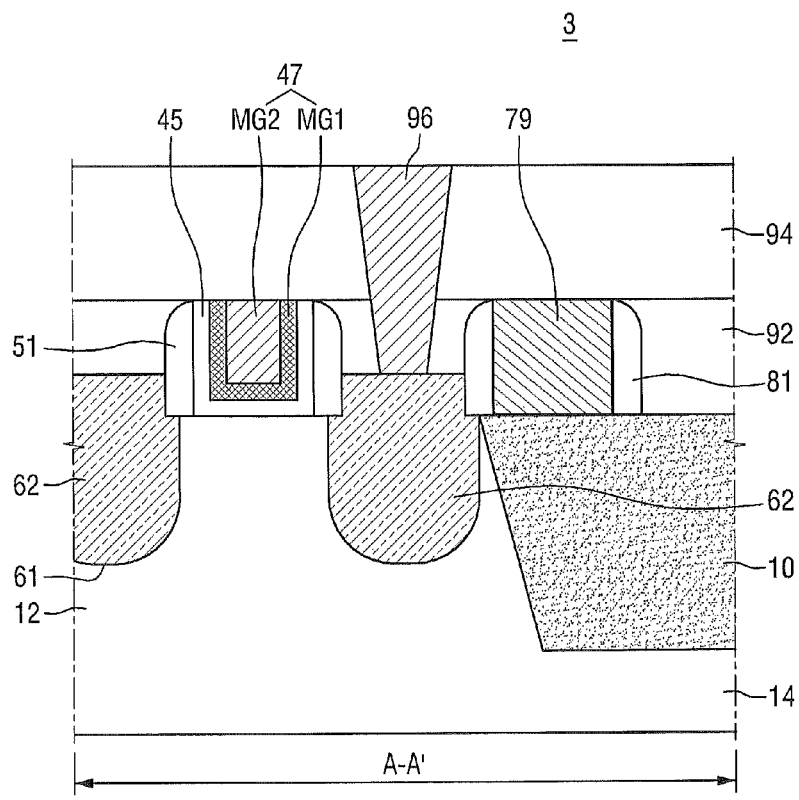
FIG. 4 is a sectional view of a semiconductor device according to some embodiments.

FIG. 4 is a sectional view of a semiconductor device according to some embodiments. In the following description, repeated explanations with respect to FIGS. 1-3 may be omitted, and the following description may describe differences with respect to FIGS. 2 and 3.

Referring to FIG. 4, in the semiconductor device 3 according to some embodiments, a dummy gate 79 may be made of, for example, polysilicon, which is one of various non-metal materials that may be used. As shown in FIG. 4, the dummy gate 79 may be formed to be distinct/separated from (rather than integrally formed with) a second interlayer dielectric layer 94. Moreover, in the semiconductor device 3, a gate insulation layer 45 may not be formed under the dummy gate 79. Accordingly, the dummy gate 79 made of for example, polysilicon, may directly contact a spacer 81.

When the dummy gate 79 is made of polysilicon, parasitic capacitance between the dummy gate 79 and a source/drain 62 may be further reduced/protected against, compared to a case when the dummy gate 79 is made of a metal. Therefore, leakage current between the dummy gate 79 and the source/drain 62 may be reduced/protected against, thereby improving the reliability of the semiconductor device 3.

Figure 5:
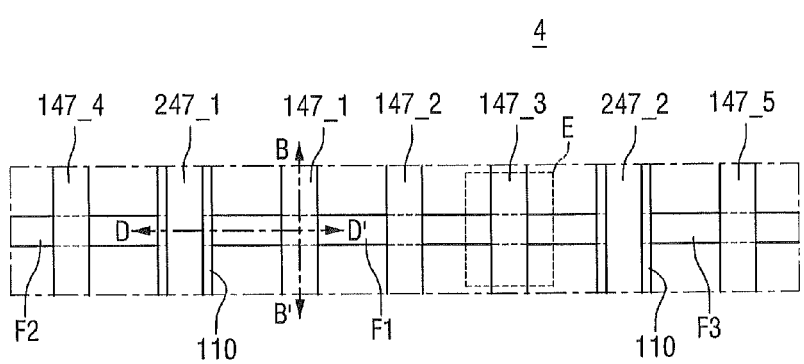
FIGS. 5 and 6 are a layout view and a perspective view, respectively, of a semiconductor device according to some embodiments.
Figure 6:
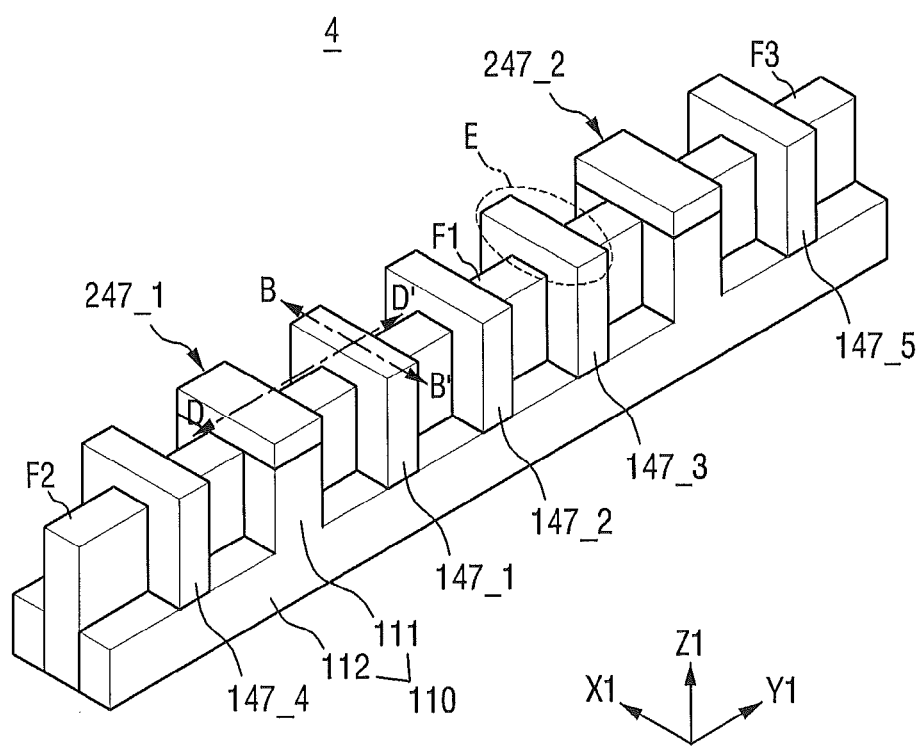
Figure 7:
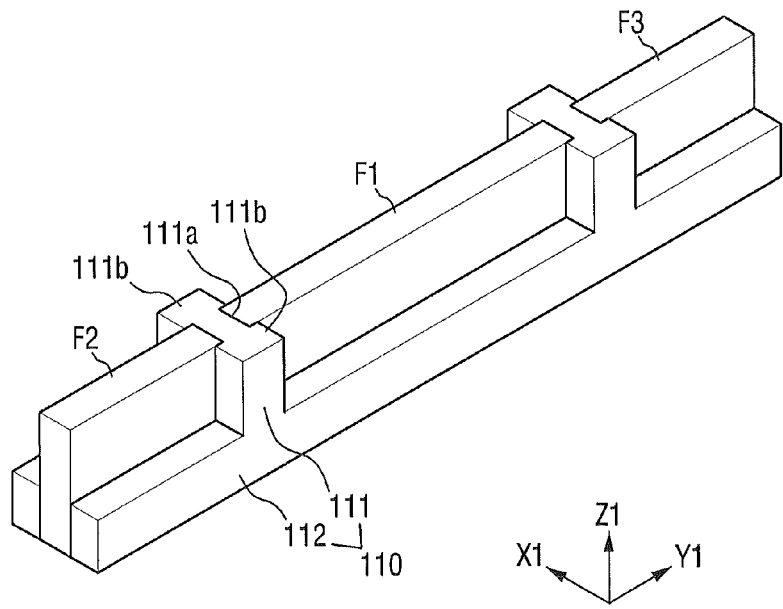
FIG. 7 is a partial perspective view illustrating an active pattern and a field insulation layer of the semiconductor device shown in FIGS. 5 and 6.
Figure 8:
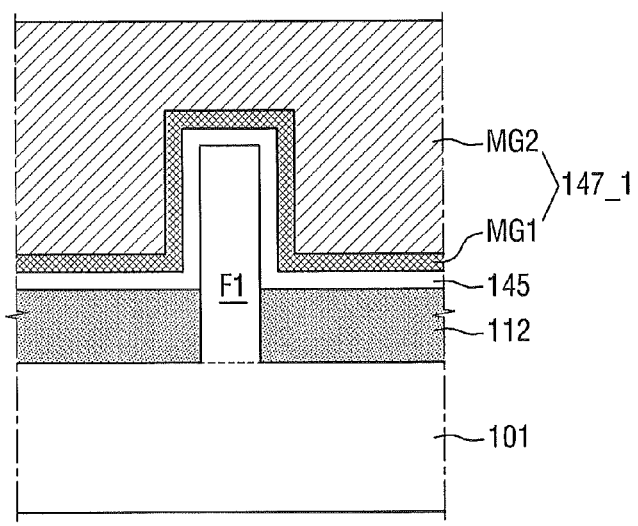
FIG. 8 is a sectional view taken along the line B-B' of FIGS. 5 and 6.
Figure 9:
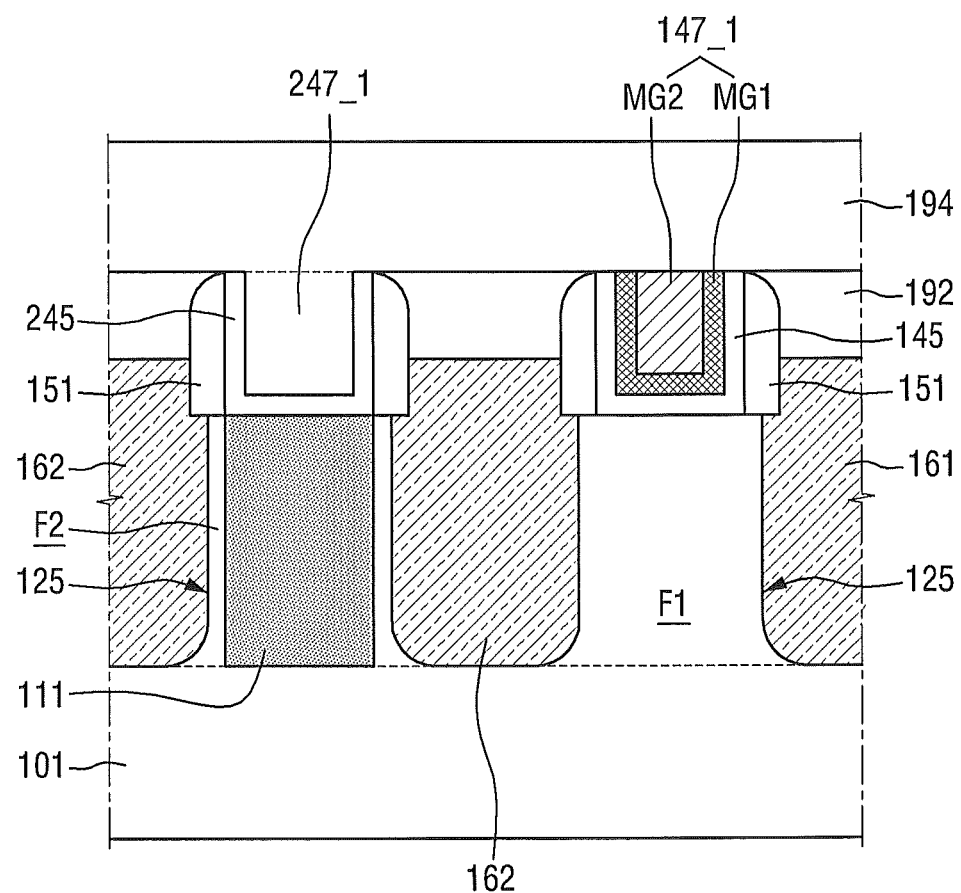
FIG. 9 is a sectional view taken along the line D-D' of FIGS. 5 and 6.
Figure 10:
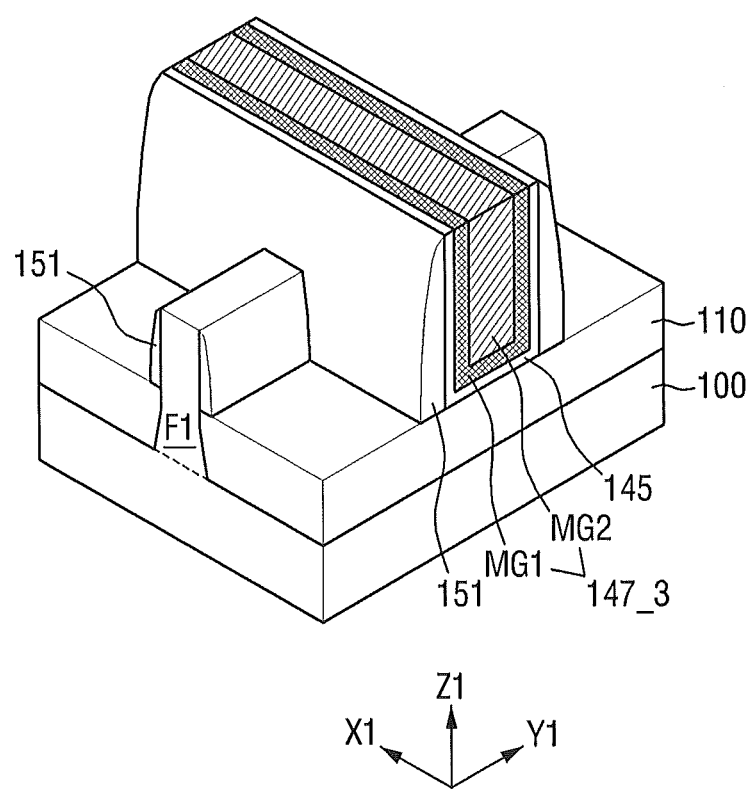
FIG. 10 is a perspective view illustrating a region 'E' of FIGS. 5 and 6.

FIGS. 5 and 6 are a layout view and a perspective view of a semiconductor device according to some embodiments, and FIG. 7 is a partial perspective view illustrating an active pattern and a field insulation layer of the semiconductor device shown in FIGS. 5 and 6. FIG. 7 shows the semiconductor device with a normal gate and a dummy gate removed from the semiconductor device shown in FIG. 6. FIG. 8 is a sectional view taken along the line B-B' of FIGS. 5 and 6, FIG. 9 is a sectional view taken along the line D-D' of FIGS. 5 and 6, and FIG. 10 is a perspective view specifically illustrating a region 'E' of FIGS. 5 and 6.

Referring to FIGS. 5 to 10, the semiconductor device 4 according to some embodiments may include a plurality of multi-channel active patterns F1 to F3, a plurality of normal gates 147_1 to 147_5, a field insulation layer 110, a plurality of dummy gates 247_1 and 247_2, and a plurality of sources/drains 161 and 162.

The plurality of multi-channel active patterns F1 to F3 may extend along a third direction Y1. The multi-channel active patterns F1 to F3 may be parts of a substrate 101, and may include an epitaxial layer grown from the substrate 101. As an example, three multi-channel active patterns F1 to F3 arranged lengthwise in parallel with each other are illustrated in FIG. 6, but the present inventive concepts are not limited thereto.

In addition, although the multi-channel active patterns F1 to F3 protruding from the substrate 101 are shaped in a rectangular parallelepiped to provide one example in FIG. 6, the present inventive concepts are not limited thereto. For example, the multi-channel active patterns F1 to F3 may be chamfered (e.g., edges of the multi-channel active patterns F1 to F3 may be beveled/curved/rounded). Because the multi-channel active patterns F1 to F3 extend lengthwise along the third direction Y1, each of the multi-channel active patterns F1 to F3 may have long sides arranged along the third direction Y1 and short sides arranged along a second direction X1. In particular, even if the edges of the multi-channel active patterns F1 to F3 are curved/rounded, it will be understood to a person having skill in the art that the sides along the third direction Y1 are longer than the sides along the second direction X1.

Meanwhile, each of the multi-channel active patterns F1 to F3 may have a body shaped of a fin or nanowire. As an example, the multi-channel active patterns F1 to F3 each shaped of a fin are illustrated in FIG. 6.

The multi-channel active patterns F1 to F3 may be active patterns used for multi-gate transistors. For example, the multi-channel active patterns F1 to F3 may be shaped of a fin, and channels may be interconnected along three surfaces of the fin. Alternatively, channels may be formed on two opposite surfaces (e.g., opposing side surfaces) of the fin. Meanwhile, when the multi-channel active patterns F1 to F3 are shaped of a nanowire, channels may be formed around the nanowire.

The field insulation layer 110 may be formed on the substrate 101 and may surround portions of the plurality of multi-channel active patterns F1 to F3. In detail, the field insulation layer 110 may include a second region 112 and a first region 111 disposed on (e.g., protruding from) the second region 112. For example, FIG. 7 illustrates that the first region 111 may be formed to contact the short sides of the multi-channel active patterns F1 to F3, and the second region 112 may be formed to contact the long sides of the multi-channel active patterns F1 to F3.

The first region 111 may be formed under/adjacent the dummy gates 247_1 and 247_2, and the second region 112 may be formed under/adjacent the normal gates 147_1 to 147_5. In other words, parts of the field insulation layer 110 (specifically, the first region 111) may be disposed between (and thus may separate) opposing multi-channel active patterns (e.g., may be between F1 and F2 or between F2 and F3). The first region 111 may be formed to extend lengthwise in the second direction X1, and the second region 112 may be formed to extend lengthwise in the third direction Y1.

In addition, as shown in FIG. 7, the field insulation layer 110 may be formed to surround terminal ends of the multi-channel active patterns F1 to F3. That is to say, the first region 111 may include a first part 111a and a second part 111b. The first part 111a and the second part 111b may have different widths. In detail, the width of the second part 111b may be greater than that of the first part 111a in the third direction Y1. As a result, the first region 111 (including the second part 111b) may surround (e.g., may wrap around) the terminal ends/surfaces of the multi-channel active patterns F1 to F3. In such a manner, it may be possible to reduce/prevent misalignment of the field insulation layer 110 and the dummy gates 247_1 and 247_2 to be formed thereon. The field insulation layer 110 may be an oxide layer, a nitride layer, an oxynitride layer or a combination thereof.

The plurality of normal gates 147_1 to 147_5 may be formed on the multi-channel active patterns F1 to F3 corresponding thereto to cross the multi-channel active patterns F1 to F3. For example, as illustrated in FIG. 5, first to third normal gates 147_1, 1472, and 147_3 may be formed on the first multi-channel active pattern F1. Moreover, a fourth normal gate 147_4 may be formed on the second multi-channel active pattern F2, and a fifth normal gate 147_5 may be formed on the third multi-channel active pattern F3. As illustrated in FIG. 6, the normal gates 147_1 to 147_5 may extend lengthwise in the second direction X1.

FIG. 6 illustrates that the plurality of dummy gates 247_1 and 247_2 may be formed on the field insulation layer 110 corresponding thereto (i.e., the first region 111 of the field insulation layer 110). For example, a first dummy gate 247_1 may be formed on the first region 111 shown in the left hand side of FIG. 6, and a second dummy gate 247_2 may be formed on the first region 111 shown in the right hand side of FIG. 6. In particular, each one of the dummy gates 247_1 and 247_2 may be formed on the corresponding first region 111. Because not more than two of the dummy gates 247_1 and 247_2 are formed and dummy gates 247_1 and 247_2 may be formed one by one, the layout size can be reduced.

Referring to FIGS. 8 and 9, each of the normal gates (e.g., 147_1) may include metal layers MG1 and MG2. The normal gate 147_1 may be formed by stacking two or more metal layers MG1 and MG2, as shown in FIGS. 8 and 9. The first metal layer MG1 may serve to adjust a work function, and the second metal layer MG2 may serve to fill a space formed by the first metal layer MG1. The first metal layer MG1 may include, for example, at least one of TiN, TaN, TiC, and TaC. In addition, the second metal layer MG2 may include W or Al. The normal gate 147_1 may be formed by, for example, a replacement process or a gate last process, but the present inventive concepts are not limited thereto.

Each of the dummy gates (e.g., 247_1) may be made of a different material from the normal gate 147_1. In detail, as described herein, when the normal gate 147_1 is made of a metal, the dummy gate 247_1 may be made of a non-metal. In some embodiments, the dummy gate 247_1 may be an insulation layer. For example, the dummy gate 247_1 may be an insulation layer integrally formed with a second interlayer dielectric layer 194. The insulation layer forming the dummy gate 247_1 may be, for example, an oxide layer. Accordingly, the second interlayer dielectric layer 194 and the dummy gate 247_1 may be both oxide layers, but the present inventive concepts are not limited thereto. The type/kind of the insulation layer forming the dummy gate 247_1 may vary in various manners.

The gate insulation layer 145 may be formed between the multi-channel active pattern F1 and the normal gate 147_1. As shown in FIG. 8, the gate insulation layer 145 may be formed on a top surface and a top portion of a lateral surface of the multi-channel active pattern F1. In addition, the gate insulation layer 145 may be formed between the normal gate 147_1 and the second region 112 of the field insulation layer 110. The gate insulation layer 145 may include a high-k dielectric material having a higher dielectric constant than a silicon oxide layer ($SiO_2$). For example, the gate insulation layer 145 may include $HfO_2$, $ZrO_2$, or $Ta_2O_5$. Meanwhile, in some embodiments, the gate insulation layer 145/245 may upwardly extend along sidewalls of the normal gate 147_1 or the dummy gate 247_1, because the normal gate 147_1 or the dummy gate 247_1 may be formed using a gate last process, for example.

Referring to FIGS. 5 to 10, a recess 125 may be formed in the multi-channel active patterns F1 to F3 between each of the plurality of normal gates 147_1 to 147_5 or between the normal gates 147_1 to 147_5 and the dummy gates 247_1 and 247_2. The source/drain 161 and 162 are formed in the recess 125. The source/drain 161 and 162 may include an epitaxial layer. In other words, the source/drain 161 and 162 may be formed by epitaxial growth.

Meanwhile, the source/drain 161 and 162 may be an elevated source/drain protruding more (e.g., farther from a surface of the substrate 101) than the multi-channel active patterns F1 to F3. Accordingly, the top surfaces of the source/drain 161 and 162 may be higher than the bottom surfaces of the normal gates 147_1 to 147_5 or the dummy gates 247_1 and 247_2.

As shown in FIG. 9, portions of the source/drain 161 and 162 may overlap (e.g., extend along) spacers 151. Portions of the source/drain 161 and 162 may undercut lower portions of the spacers 151. A spacer 151 may include at least one of a nitride layer and an oxynitride layer. The spacer 151 may be formed on sidewalls of the plurality of multi-channel active patterns F1 to F3, the plurality of normal gates 147_1 to 147_5, and the plurality of dummy gates 247_1 and 247_2. In FIG. 10, a lateral surface of the spacer 151 is curved, but the present inventive concepts are not limited thereto. Rather, the shape of the spacer 151 may vary in various manners. For example, in some embodiments, the spacer 151 may be formed in an I or L shape.

The substrate 101 may be a substrate made of one or more semiconductor materials selected from the group consisting of, for example, Si, Ge, SiGe, GaP, GaAs, SiC, SiGeC, InAs and InP. In some embodiments, the substrate 101 may be a silicon on insulator (SOI) substrate.

Referring to FIGS. 6 and 9, the first region 111 of the field insulation layer 110 may be disposed on the second region 112. A top surface of at least a portion of the field insulation layer 110 (e.g., a top surface of the first region 111) may be formed at substantially the same height as (e.g., may be substantially coplanar with) the top surfaces of the multi-channel active patterns F1 to F3. Accordingly, the top surface of the first region 111 may be lower than the top surfaces of the source/drain 161 and 162, but the present inventive concepts are not limited thereto. Moreover, in some embodiments, the top surface of the first region 111 may be lower than the top surfaces of the multi-channel active patterns F1 to F3. For example, although FIGS. 7 and 9 illustrate that the top surface of the first region 111 is formed at the same height as the top surfaces of the multi-channel active patterns F1 to F3, the present inventive concepts are not limited thereto.

Furthermore, the top surfaces of the dummy gates 247_1 and 247_2 and the top surfaces of the normal gates 147_1 to 147_5 may be substantially coplanar with each other. For example, when the dummy gates 247_1 and 247_2 and the normal gates 147_1 to 147_5 are formed using planarization, the top surfaces thereof may be positioned at substantially the same height. As shown in FIG. 9, a first interlayer dielectric layer 192 may be positioned on both (e.g., opposing) sides of the dummy gates 247_1 and 247_2 and the normal gates 147_1 to 147_5. The first interlayer dielectric layer 192 may be, for example, a planarization layer.

As described herein, if the dummy gates 247_1 and 247_2 are formed of, for example, oxide layers, parasitic capacitance between the source/drain 161 and 162 formed in the multi-channel active patterns F1 to F3 and the dummy gates 247_1 and 247_2 can be reduced. Accordingly, leakage current between the dummy gates 247_1 and 247_2 and the source/drain 161 and 162 can be reduced, thereby improving the reliability of the semiconductor device 4.

Figure 11:
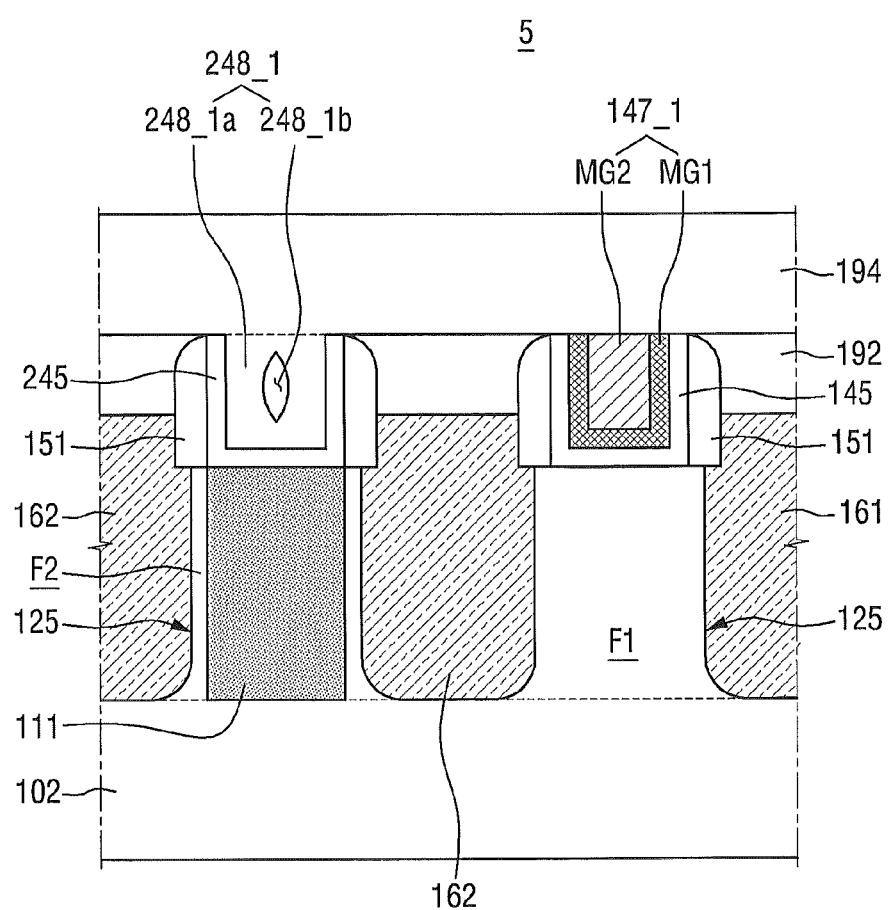
FIG. 11 is a sectional view of a semiconductor device according to some embodiments.

FIG. 11 is a sectional view of a semiconductor device according to some embodiments. In the following description, repeated explanations with respect to FIGS. 1-10 may be omitted, and the following description may describe differences with respect to FIGS. 2-10. Referring to FIG. 11, in the semiconductor device 5 according to some embodiments, a dummy gate 248_1 may further include a gap 248_1b. In detail, in the semiconductor device 5 according to some embodiments, the dummy gate 248_1 may include an insulation layer 248_1a and the gap 248_1b. The insulation layer 248_1a forming the dummy gate 248_1 may be integrally formed with a second interlayer dielectric layer 194, as described with respect to FIGS. 2, 3, and 9.

When the dummy gate 248_1 includes the gap 248_1b, parasitic capacitance between the dummy gate 248_1 and a source/drain 162 may be further reduced. Therefore, leakage current between the dummy gate 248_1 and the source/drain 162 may be further reduced, thereby improving the reliability of the semiconductor device 5.

Figure 12:
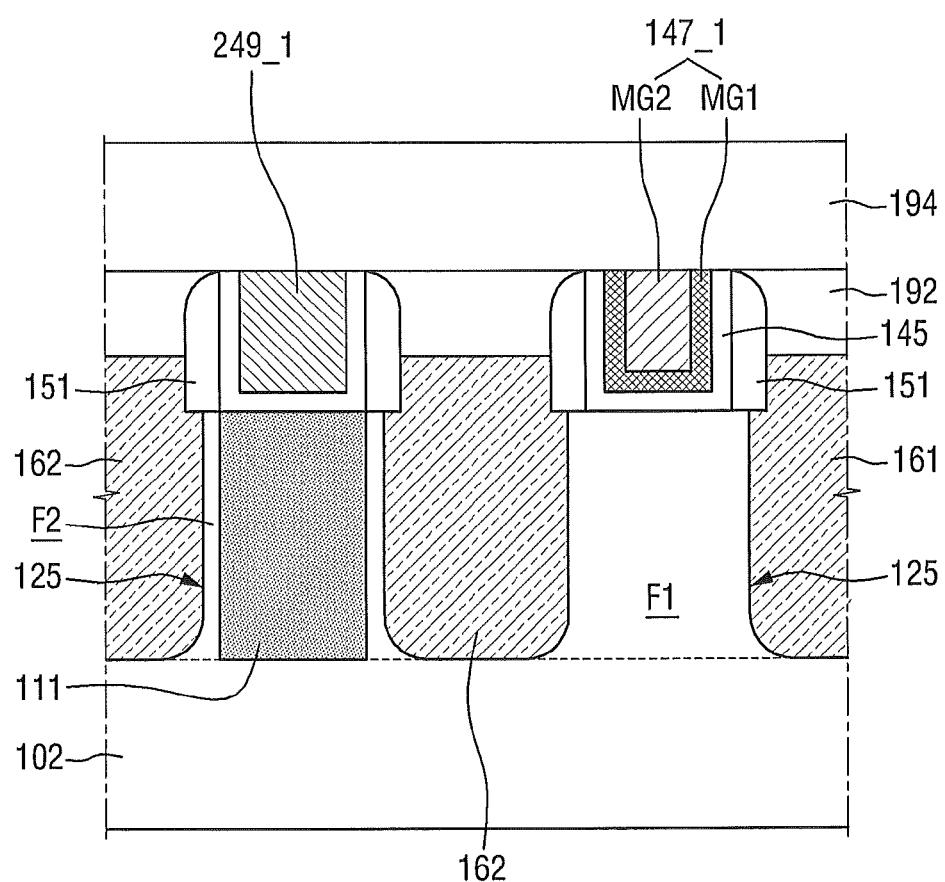
FIG. 12 is a sectional view of a semiconductor device according to some embodiments.

FIG. 12 is a sectional view of a semiconductor device according to some embodiments. In the following description, repeated explanations with respect to FIGS. 1-11 may be omitted, and the following description may describe differences with respect to FIGS. 2-11. Referring to FIG. 12, in the semiconductor device 6 according to some embodiments, a dummy gate 249_1 may be made of, for example, polysilicon, which is one of various non-metal materials. As shown in FIG. 12, the dummy gate 249_1 may be formed to be distinct/separated from a second interlayer dielectric layer 194. Meanwhile, in the semiconductor device 6 according to some embodiments, a gate insulation layer 145 may not be formed under the dummy gate 249_1. Accordingly, the dummy gate 249_1 made of, for example, polysilicon, may directly contact a spacer 151.

In embodiments in which the dummy gate 249_1 is made of polysilicon, parasitic capacitance between the dummy gate 249_1 and a source/drain 162 may be further reduced, compared to a case in which the dummy gate 249_1 is made of a metal. Therefore, leakage current between the dummy gate 249_1 and the source/drain 162 may be reduced, thereby improving the reliability of the semiconductor device 6.

Figure 13:
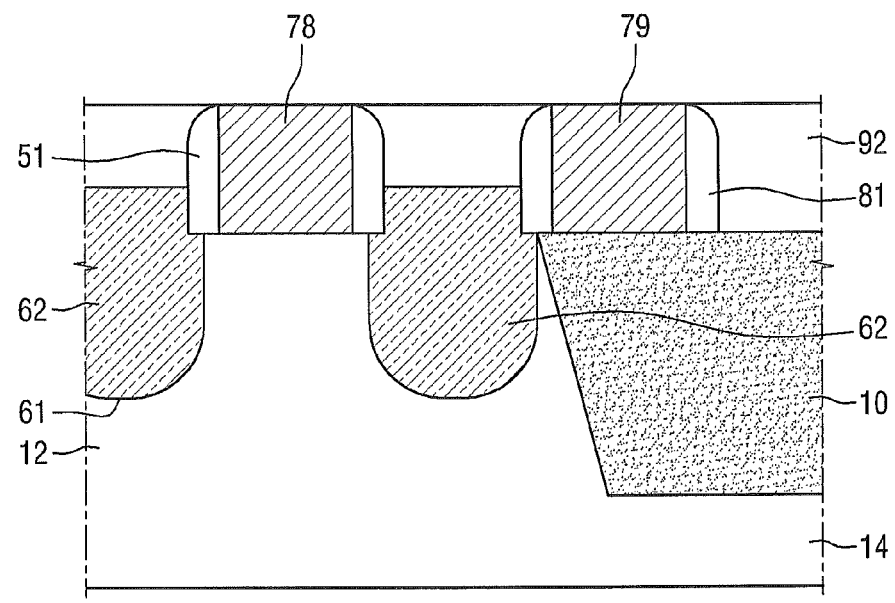
FIGS. 13 to 15 illustrate intermediate process steps for explaining methods for fabricating a semiconductor device according to some embodiments of the present inventive concepts.
Figure 14:
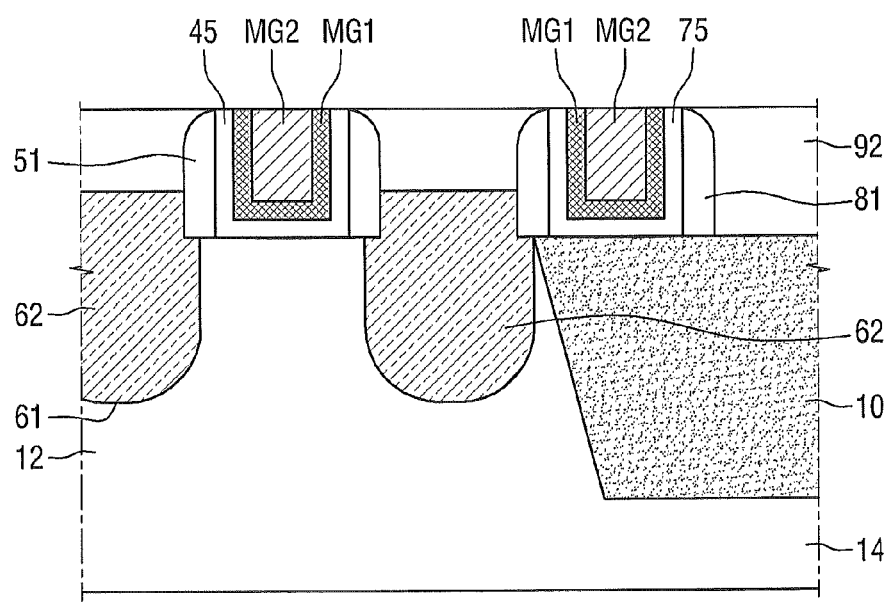
Figure 15:
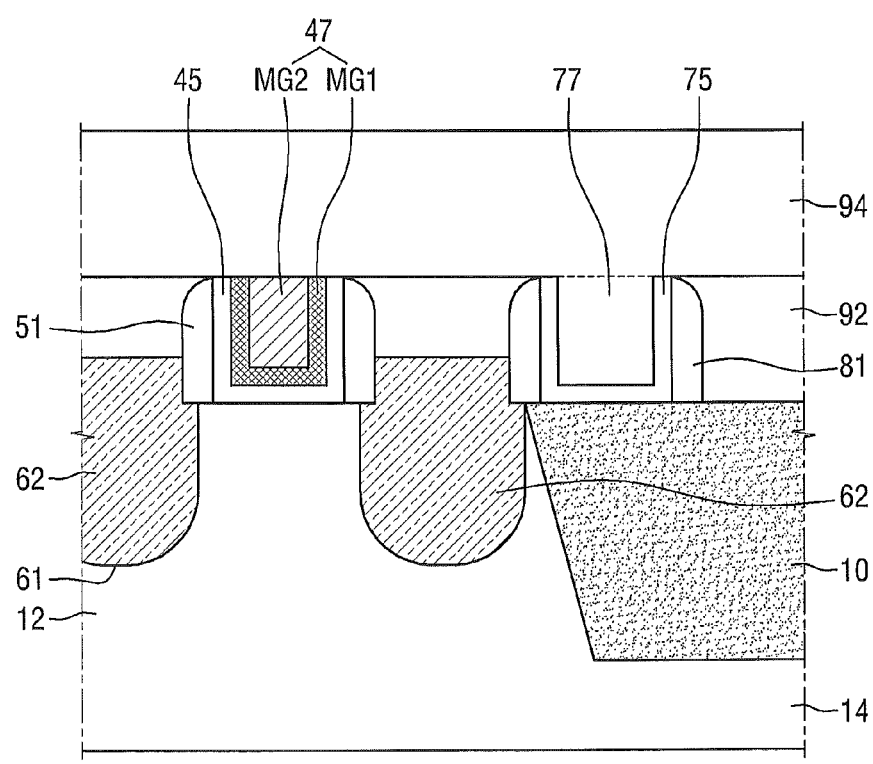

FIGS. 13 to 15 illustrate intermediate process steps for explaining methods for fabricating a semiconductor device according to some embodiments. First, referring to FIG. 13, a substrate 14 having an active pattern 12 and a field insulation layer 10 disposed thereon is provided. In detail, a recess extending in the first direction (direction X of FIG. 1) is formed on the substrate 14, and the field insulation layer 10 is then formed in the recess, thereby forming the active pattern 12 and the field insulation layer 10 extending in the first direction (direction X of FIG. 1).

Next, pre-gates 78 and 79 are formed on the active pattern 12 and the field insulation layer 10, respectively. The pre-gates 78 and 79 may be formed on the active pattern 12 and the field insulation layer 10 by forming a polysilicon layer on the active pattern 12 and the field insulation layer 10 and then patterning the same.

Spacers 51 and 81 may be subsequently formed on both (e.g., opposing) sides of the formed pre-gates 78 and 79. A recess 61 is formed in the active pattern 12 adjacent the pre-gate 78. The recess 61 may be formed to expose portions of bottom surfaces of the spacers 51 and 81.

Next, the source/drain 62 is formed in the recess 61 through epitaxial growth, for example. The formed source/drain 62 may be formed to be higher than bottom surfaces of the pre-gates 78 and 79. Accordingly, the source/drain 62 according to some embodiments may be an elevated source/drain 62.

Then, a first interlayer dielectric layer 92 covering the pre-gates 78 and 79 is formed. The first interlayer dielectric layer 92 is subsequently planarized to expose the top surfaces of the pre-gates 78 and 79.

Next, referring to FIG. 14, the exposed pre-gates 78 and 79 are removed. Then, gate insulation layers 45 and 75, a first metal layer MG1, and a second metal layer MG2 are sequentially formed in spaces having the pre-gates 78 and 79 removed therefrom, followed by planarization. Accordingly, the gate insulation layers 45 and 75 and the first metal layer MG1 may upwardly extend adjacent sidewalls of the spacers 51 and 81, respectively, as shown in FIG. 14.

Referring now to FIG. 15, the first metal layer MG1 and the second metal layer MG2 formed on the field insulation layer 10 (and between the spacers 81) are removed. The removal of the first and second metal layers MG1 and MG2 may be achieved by, for example, dry etching the first and second metal layers MG1 and MG2 using an etchant prepared by mixing chlorine (Cl) and fluorine (F), but the present inventive concepts are not limited thereto.

Next, a second interlayer dielectric layer 94 is formed on the first interlayer dielectric layer 92. The second interlayer dielectric layer 94 may also be formed in a space/location on the field insulation layer 10 from which the first metal layer MG1 and the second metal layer MG2 were removed. In some embodiments, a portion of the second interlayer dielectric layer 94 may be used as a dummy gate 77.

Although methods for fabricating the semiconductor device have been described by way of example with regard to the semiconductor device 1 shown in FIG. 2, the fabrication methods of other semiconductor devices (e.g., the semiconductor devices 2 or 3) may also be inferred based on the fabrication methods described herein. For example, regarding the semiconductor device 2 of FIG. 3, when the second interlayer dielectric layer 94 is formed on the first interlayer dielectric layer 92 (which may result in poor step coverage), the space/location on the field insulation layer 10 from which the first metal layer MG1 and the second metal layer MG2 are removed may not be completely filled by the second interlayer dielectric layer 94, but rather may include a gap (e.g., the gap 78b of FIG. 3) formed therein. In such a manner, the semiconductor device 2 may be completed. In another example, regarding the semiconductor device 3 of FIG. 4, after the process shown in FIG. 13, only the pre-gate 78 formed on the active pattern 12 (and between the spacers 51) is replaced with the first metal layer MG1 and the second metal layer MG2 before forming the second interlayer dielectric layer 94 without removing the pre-gate 79 formed on the field insulation layer 10 (and between the spacers 81), thereby fabricating the semiconductor device 3. Furthermore, in the examples of the semiconductor devices 4 to 6 of FIGS. 5-12, the fabrication methods of the semiconductor devices 4 to 6 will be understood by one skilled in the art, and repeated explanations thereof may be omitted.

Figure 16:
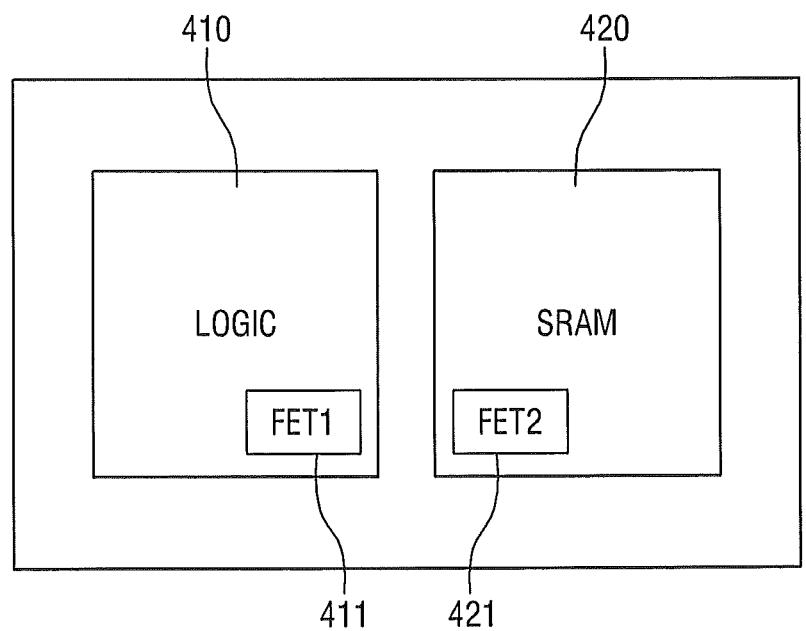
FIG. 16 is a conceptual view of a semiconductor device according to some embodiments.
Figure 17:
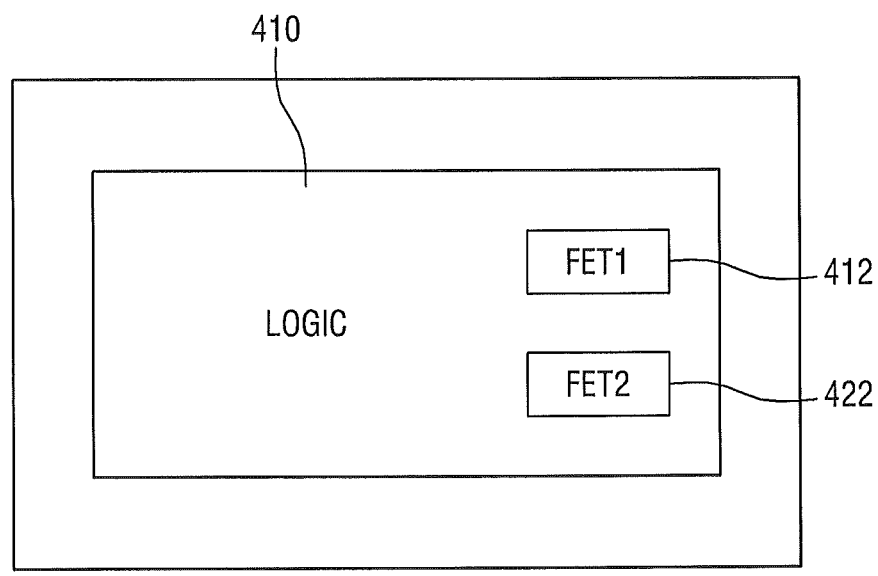
FIG. 17 is a conceptual view of a semiconductor device according to some embodiments.

FIGS. 16 and 17 are conceptual views of respective semiconductor devices according to some embodiments of the present inventive concepts. Referring to FIG. 16, in a semiconductor device 7 according to some embodiments, a first transistor 411 may be disposed in a logic region 410, and a second transistor 421 may be disposed in an Static Random-Access Memory (SRAM) region 420.

Referring to FIG. 17, in a semiconductor device 8 according to some embodiments, first and second transistors (e.g., Field Effect Transistors (FETs)) 412 and 422 different from each other may be disposed in a logic region 410. In addition, first and second transistors 412 and 422 different from each other may also be disposed in an SRAM region 420.

In FIGS. 16 and 17, the first transistor 411, 412 may be a selected one of the semiconductor devices 1 to 6 described herein, and the second transistor 421, 422 may be a different one of the semiconductor devices 1 to 6 (e.g., different from the selected semiconductor device). For example, the first transistor 411, 412 may be the semiconductor device 1 shown in FIG. 2, and the second transistor 421, 422 may be the semiconductor device 4 shown in FIG. 9. Alternatively, the first transistor 411, 412 may be the semiconductor device 4 shown in FIG. 9, and the second transistor 421, 422 may be the semiconductor device 5 shown in FIG. 11.

The logic region 410 and the SRAM region 420 are both illustrated in FIG. 16 by way of example, but aspects of the present inventive concepts are not limited thereto. For example, in some embodiments, the semiconductor device 7 can be applied to a region with a different memory from the memory of the logic region 410 (for example, a Dynamic Random-Access Memory (DRAM), Magnetoresistive Random-Access Memory (MRAM), Resistive Random-Access Memory (RRAM), or Phase-Change Random Access Memory (PRAM), etc.).

Figure 18:
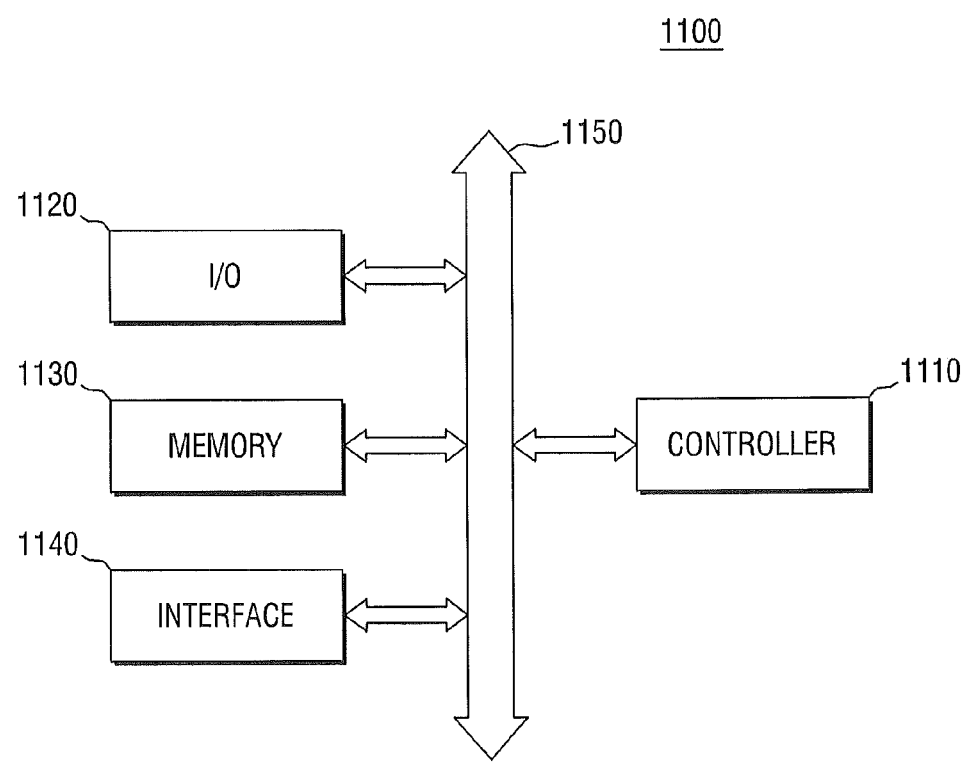
FIG. 18 is a block diagram of an electronic system including a semiconductor device according to some embodiments.

FIG. 18 is a block diagram of an electronic system including a semiconductor device according to some embodiments of the present inventive concepts. Referring to FIG. 18, the electronic system 1100 may include a controller 1110, an input/output device (I/O) 1120, a memory 1130, an interface 1140, and a bus 1150. The controller 1110, the I/O 1120, the memory 1130, and/or the interface 1140 may be connected to each other through the bus 1150, which corresponds to a path along which data moves.

The controller 1110 may include at least one of a microprocessor, a digital signal processor, a microcontroller, and logic devices capable of performing functions similar to those of these components. The I/O 1120 may include a keypad, a keyboard, a display, and the like. The memory 1130 may store data and/or commands.

The interface 1140 may transmit data to a communication network or receive data from the communication network. The interface 1140 may be wired or wireless. For example, the interface 1140 may include an antenna or a wired/wireless transceiver. The electronic system 1100 may be an operating memory for improving the operation of the controller 1110 and may further include a high-speed DRAM and/or SRAM.

A fin field effect transistor according to some embodiments may be provided in the memory 1130 or may be provided as part of the controller 1110 or the I/O 1120. The electronic system 1100 may be applied to a personal digital assistant (PDA), a portable computer, a tablet (e.g., a web tablet), a wireless phone, a mobile phone, a digital music player, a memory card, or any type of electronic device capable of transmitting and/or receiving information in a wireless environment.

Figure 19:
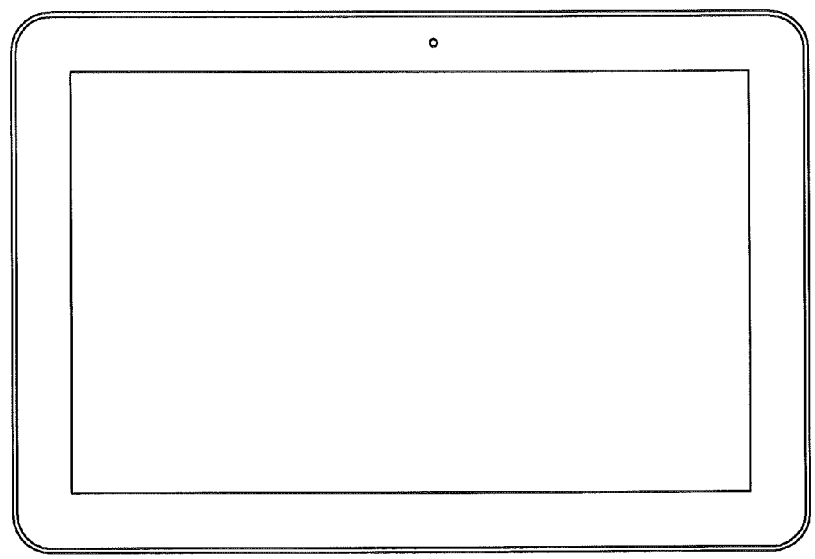
FIGS. 19 and 20 illustrate exemplary semiconductor systems to which a semiconductor device according to some embodiments of the present inventive concepts can be applied.
Figure 20:
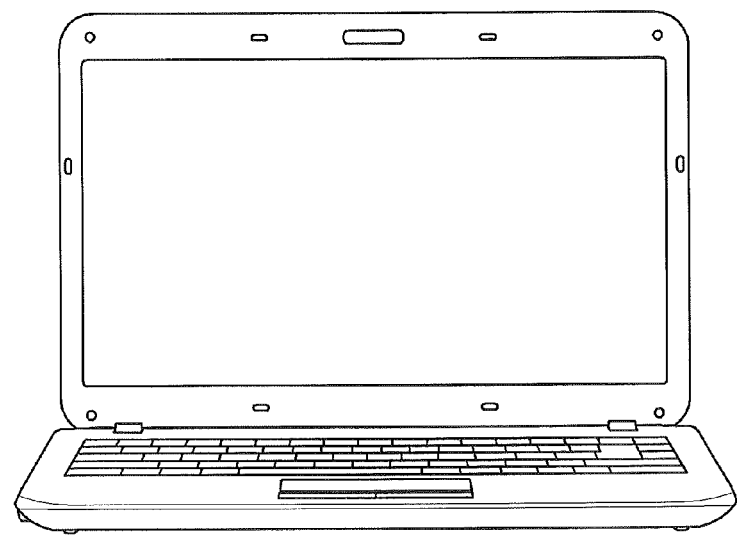

FIGS. 19 and 20 illustrate exemplary semiconductor systems to which the semiconductor device according to some embodiments of the present inventive concepts can be applied.

Specifically, FIG. 19 illustrates a tablet (e.g., a tablet PC), and FIG. 20 illustrates a notebook/laptop computer. At least one of the semiconductor devices 1-6 according to some embodiments of the present inventive concepts can be applied to the tablet, the laptop computer, or the like. Moreover, it will be understood by one skilled in the art that at least one of the semiconductor devices 1-6 according to some embodiments of the present inventive concepts can be applied to other integrated circuit devices not illustrated herein.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
   a substrate including an active pattern and a field insulation layer adjacent the active pattern;
   a gate on the active pattern and including a first material;
   a dummy gate on the field insulation layer and including a second material different from the first material, the dummy gate comprising only one gap therein;
   respective spacers adjacent the gate and the dummy gate; and
   an elevated source/drain region formed in the active pattern and between the gate and the dummy gate, the elevated source/drain region undercutting the respective spacers adjacent the gate and the dummy gate,
   wherein the first material comprises a metal and the second material comprises a non-metal, and
   wherein a top surface of the elevated source/drain region protrudes beyond a portion of the gap.

2. The semiconductor device of claim 1, wherein the second material comprises an insulating material.

3. The semiconductor device of claim 2, further comprising a first interlayer dielectric layer contacting the dummy gate, wherein the dummy gate and the first interlayer dielectric layer comprise respective portions of a same material.

4. The semiconductor device of claim 2, wherein the top surface of the elevated source/drain region protrudes beyond a bottom surface of the insulating material of the dummy gate.

5. The semiconductor device of claim 1, wherein the second material comprises polysilicon.

6. The semiconductor device of claim 1, further comprising a gate insulation layer under the gate or the dummy gate.

7. The semiconductor device of claim 1, wherein a top surface of the active pattern is substantially coplanar with a top surface of the field insulation layer.

8. The semiconductor device of claim 1, wherein the active pattern comprises a fin shape protruding from the substrate.

9. A semiconductor device comprising:
   an active pattern and a field insulation layer on a substrate;
   a first gate insulation layer on the active pattern;
   a gate on the first gate insulation layer;
   a second gate insulation layer spaced apart from the first gate insulation layer and on the field insulation layer;
   an interlayer dielectric layer vertically overlapping the gate and contacting the second gate insulation layer,
   wherein a portion of the interlayer dielectric layer contacting the second gate insulation layer comprises a dummy gate, the dummy gate comprising only one gap therein; and
   an elevated source/drain region formed in the active pattern and between the gate and the dummy gate,
   wherein a top surface of the elevated source/drain region protrudes beyond a portion of the gap,
   wherein the first gate insulation layer upwardly extends along sidewalls of the gate, and
   wherein the second gate insulation layer upwardly extends along sidewalls of the dummy gate.

10. The semiconductor device of claim 9, wherein:
    the gate includes a metal and the interlayer dielectric layer includes an oxide layer.

11. A semiconductor device comprising:
    an insulation layer on a substrate;
    a metal gate spaced apart from the insulation layer and on an active pattern of the substrate, wherein a top surface of the active pattern and a top surface of the insulation layer are substantially coplanar;
    a non-metal dummy gate on the insulation layer, the non-metal dummy gate comprising only one gap therein;
    a first dielectric layer on the metal gate and on the non-metal dummy gate comprising the one gap therein;
    an elevated source/drain region formed in the active pattern and between the metal gate and the non-metal dummy gate comprising the one gap therein; and
    a second dielectric layer on the elevated source/drain region, wherein the first dielectric layer on the non-metal dummy gate comprising the one gap therein is on the second dielectric layer that is on the elevated source/drain region, and
    wherein a top surface of the elevated source/drain region protrudes beyond a portion of the gap.

12. The semiconductor device of claim 11, wherein the non-metal dummy gate comprises a same material as the first dielectric layer.

13. The semiconductor device of claim 11, wherein:
    the non-metal dummy gate and the first dielectric layer comprise different non-metal materials; and
    a top surface of the metal gate and a top surface of the non-metal dummy gate are substantially coplanar.

14. The semiconductor device of claim 3, further comprising:
    a second interlayer dielectric layer on the elevated source/drain region,
    wherein the first interlayer dielectric layer contacting the dummy gate is on the second interlayer dielectric layer that is on the elevated source/drain region.

15. The semiconductor device of claim 11, further comprising respective spacers adjacent the metal gate and the non-metal dummy gate,
    wherein the elevated source/drain region undercuts the respective spacers adjacent the metal gate and the non-metal dummy gate, and
    wherein the second dielectric layer extends continuously from the spacer adjacent the non-metal dummy gate to the spacer adjacent the metal gate.

16. The semiconductor device of claim 9, wherein the active pattern comprises a fin shape protruding from the substrate.

17. The semiconductor device of claim 11, wherein the active pattern comprises a fin shape protruding from the substrate.

* * * * *